United States Patent
Glover

(10) Patent No.: US 9,922,264 B2
(45) Date of Patent: Mar. 20, 2018

(54) PATH COMPRESSION OF A NETWORK GRAPH

(71) Applicant: International Business Machines Corporation, Armonk, NY (US)

(72) Inventor: Raymond S. Glover, Saffron Walden (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/285,906

(22) Filed: Oct. 5, 2016

(65) Prior Publication Data

US 2017/0085275 A1    Mar. 23, 2017

Related U.S. Application Data

(63) Continuation of application No. 14/856,789, filed on Sep. 17, 2015.

(51) Int. Cl.
G06K 9/00 (2006.01)
G06K 9/46 (2006.01)
G06F 17/30 (2006.01)
H03M 7/30 (2006.01)

(52) U.S. Cl.
CPC ..... *G06K 9/4638* (2013.01); *G06F 17/30958* (2013.01); *G06K 9/469* (2013.01); *H03M 7/30* (2013.01)

(58) Field of Classification Search
None
See application file for complete search history.

(56) References Cited

U.S. PATENT DOCUMENTS

| | | |
|---|---|---|
| 5,051,745 A | 9/1991 | Katz |
| 6,741,552 B1 | 5/2004 | McCrosky et al. |
| 7,143,046 B2 | 11/2006 | Babu et al. |
| 7,580,918 B2 | 8/2009 | Chang et al. |
| 7,715,392 B2 | 5/2010 | Huang et al. |
| 9,178,831 B2 | 11/2015 | Eastlake, III |

(Continued)

OTHER PUBLICATIONS

Batz et al., "Compressed Transmssion of Route Descriptions", Cornell University Library, arXiv:1011.4465v1 [cs.DS], submitted: Nov. 19, 2010, 7 pages.

(Continued)

*Primary Examiner* — Weiwen Yang
(74) *Attorney, Agent, or Firm* — Gilbert Harmon, Jr.

(57) ABSTRACT

In an approach to analyzing a path on a graph, a computer receives a graph comprising a plurality of vertices and edges, each edge linking two vertices. The computer, for each one of said plurality of vertices, analyzes edges linked to said one of plurality of vertices to determine a number of outbound links from said one of plurality of vertices, orders said edges, and assigns a value to each ordered edge. The computer, for the graph, receives a path comprising a plurality of edges linking two of said plurality of vertices through at least one other of said plurality of vertices, encodes said path, the encoding using said number of outbound links and said assigned values of each of said one or more edges linking said two of said plurality of vertices, compresses the encoded path, and analyzes said path on said graph using said compressed, encoded path.

7 Claims, 5 Drawing Sheets

(56) References Cited

U.S. PATENT DOCUMENTS

| | | | |
|---|---|---|---|
| 2008/0232275 A1* | 9/2008 | Eswaran | H04L 12/4625 |
| | | | 370/256 |
| 2009/0263029 A1* | 10/2009 | Chang | G06T 17/20 |
| | | | 382/232 |
| 2013/0091266 A1 | 4/2013 | Bhave et al. | |
| 2014/0136498 A1* | 5/2014 | Finis | G06F 17/30356 |
| | | | 707/695 |
| 2015/0019592 A1 | 1/2015 | Jin et al. | |

OTHER PUBLICATIONS

Yuan et al., "Fast Iterative Graph Computation: A Path Centric Approach", IEEE, SC '14- Proceedings of the International Conference for High Performance Computing, Networking, Storage and Analysis, pp. 401-412, Nov. 16, 2014.

"Size and Scope of the National ANPR Data Centre's Database", What Do They Know, HMP Britain, Jun. 6, 2010, 2 pages, <https://www.whatdotheyknow.com/request/size_and_scope_of_the_national_a>.

Watts et al., "Collective dynamics of 'small-world' networks", Nature, vol. 393, No. 6684. (1998), pp. 409-410, Received: Nov. 27, 1997, Accepted: Apr. 6, 1998.

Buriol et al., "Speeding Up Dynamic Shortest-Path Algorithms", INFORMS Journal on Computing, vol. 20, Issue 2, Apr. 2008, pp. 191-204, <www.inf.ufrgs.br/netschool/index_files/02_2/pdf>.

U.S. Appl. No. 14/856,789, filed Sep. 17, 2015.

List of IBM Patents or Patent Applications Treated as Related (Appendix P), filed herewith.

* cited by examiner

US 9,922,264 B2

PATH COMPRESSION OF A NETWORK GRAPH

BACKGROUND

The present invention relates to data compression, and more specifically to path compression of a network graph by encoding hops within a path.

Data compression is a technique used ubiquitously across many domains in computing, in order to optimize the storage or network requirements for a given system. In lossless compression, the original message can be perfectly reconstructed (decompressed) from the compressed version of the message. The most commonly used compressors work by removing redundancy in data by exploiting the patterns that appear within it. The extent they can do this is fundamentally limited by the data's predictability; a measure of its entropy. Many domain-specific compression algorithms are in use which make assumptions about the underlying data to improve compression performance JPEG, GIF, PNG (image compression formats) and MP3, FLAC (audio compression formats) are examples of both lossless and lossy domain-specific algorithms that make such assumptions.

Many analytical problems can be modelled as the interacting nodes of a graph. One of the most common structures of practical use in graph analytics is the path. While graph compression is a very active area of research, and specialized compression techniques have been devised to aid in the storage, transmission and computation of data on a variety of graph problems, known graph compression techniques do not address compression of paths within a graph.

Delta encoding within the context of graphs has been tried, but delta encoding has not been applied so as to incorporate the actual structure (connectivity of nodes) of the graph itself.

SUMMARY

Embodiments of the present invention include a computer-implemented method, a computer system and a computer program product of analyzing a path on a graph. The computer implemented method includes a computer receiving a graph, said graph comprising a plurality of vertices and a plurality of edges, each of said edges linking two of said plurality of vertices; for each one of said plurality of vertices: analyzing said edges linked to said one of said plurality of vertices to determine a number of outbound links from said one of said plurality of vertices; and ordering said edges and assigning a value to each of said ordered edges; for the graph: receiving a path, said path comprising a plurality of said plurality of edges linking two of said plurality of vertices through at least one other of said plurality of vertices; encoding said path, the encoding using said determined number of outbound links and said assigned values of each of said one or more edges linking said two of said plurality of vertices; compressing the encoded path; and analyzing said path on said graph using said compressed, encoded path.

BRIEF DESCRIPTION OF THE DRAWINGS

Preferred embodiments of the present invention will now be described in more detail, by way of example only, with reference to the accompanying drawings, in which.

DETAILED DESCRIPTION

Applications of embodiments of the present invention include the compression of data obtained from transportation networks. Automatic number plate recognition (ANPR) systems generate many millions of data-points per day, which can be modelled as a set of paths through a network. Number, or license, plates of vehicles are recognized and their movement can be modelled as a set of paths through the road, or highway, network. Such modeling is useful for both traffic information and traffic management so as to reduce journey times. In the United Kingdom in 2010, there were in excess of 4,000 cameras supplying ANPR data. Due to the amount of processing required, it is infeasible to perform complex types of data-mining online, in near real-time, to discover complex patterns of behavior that might be of interest. The long-term archiving of such large amounts of data, currently hundreds of terabytes per year, can be costly. In the United Kingdom in 2010, such data was typically held for a period of not more than two years. Other applications of embodiments of the present invention include the compression of data obtained from social networks, paper citation networks, the World Wide Web, biological networks and the like. In the example of social networks, the vertices are people and the edges are connections, in paper citation networks, the vertices are papers and the edges are citations, in the World Wide Web, the vertices are webpages and the edges are links and in biological networks, the vertices might be interacting species or amino acids and the edges might be the interactions between the species or the amino acids. In another example of a biological network, there is an inferred relationship/correlation between pairs of genes through co-expression, which can be used to create a gene co-expression network. Each vertex in the network represents a gene and each edge represents a correlation (or co-expression) between a gene-pair.

Figure 1:
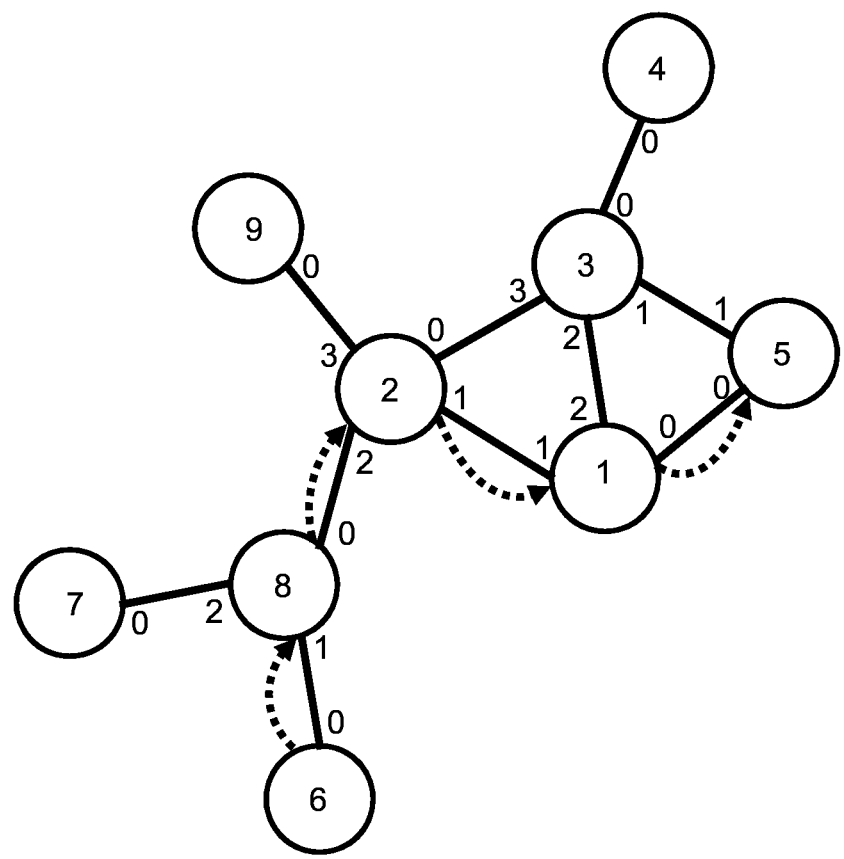
FIG. 1 shows an example network graph in which embodiments of the present invention may be used.

FIG. 1 shows an example network graph in which embodiments of the present invention may be used. Vertices are shown, numbered 1 thru 9, in FIG. 1. Edges (or connections) are links between each of the vertices and are shown in FIG. 1 as solid lines joining two vertices. A path is a sequence of edges in a graph which connect together to create a walk in a single direction through a subset of the graph. An example of a path is shown in FIG. 1 by the dashed curved lines. The path starts at vertex 6 and goes through vertices 8, 2 and 1 to vertex 5. The complete path may be written as {6, 8, 2, 1, 5}. There is no restriction on the number of times any vertex may appear in the path, so long as such appearances are non-consecutive. Another example (not shown in FIG. 1) of a path starts at vertex 6 and goes through vertices 8, 2, 1, 3, 2 and 1 to vertex 5. This complete path may be written as {6, 8, 2, 1, 3, 2, 1, 5}.

Figure 2:
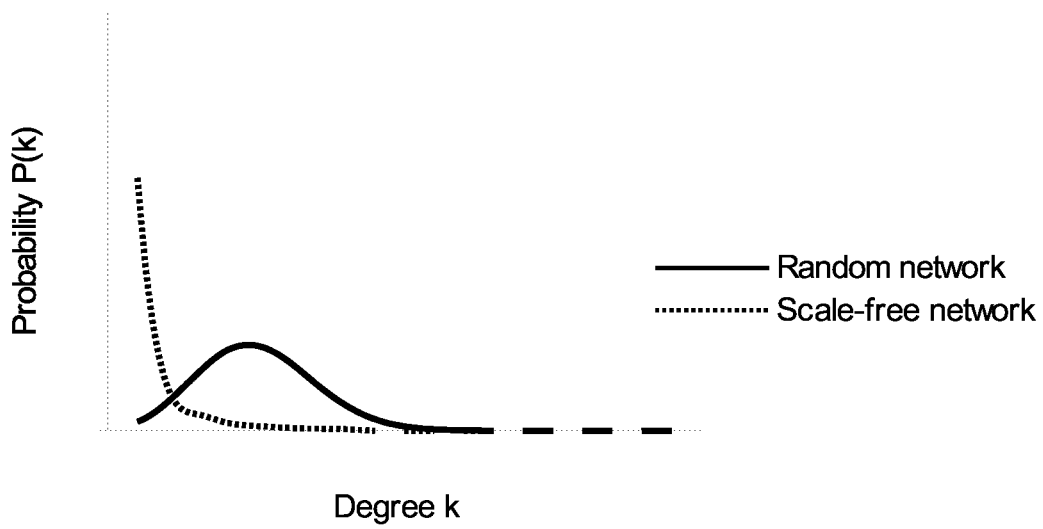
FIG. 2 shows a plot of the degree distribution of a random network and a scale-free network.

FIG. 2 shows a plot of the degree distribution of a random network and a scale-free network. The degree of a vertex in a network is the number of edges the vertex has to connect it to other edges. If a network is directed, that is that the edges point in one direction from one vertex to another vertex, then vertices have an in-degree, which is the number of incoming edges, and an out-degree, which is the number of outgoing edges. If a network is not directed, then vertices will simply have a degree. In the example of FIG. 1, nodes 6, 7, 9 and 4 have a degree of one, node 5 has a degree of two, nodes 8 and 1 have a degree of three and nodes 2 and 3 have a degree of four. Each of the edges in the example of FIG. 1 is bi-directional. The degree distribution of a network is defined as the fraction of vertices in the network that have degree k. If there are n vertices in a network and $n_k$ of them have a degree k, then $P(k)=n_k/n$.

A simple network, such as a random graph, is one in which each of the n vertices has a connection (or edge) to another vertex with a probability of p. The probability of each of the n vertices not having a connection (or edge) to another vertex is (1−p). The degree k has a binomial distribution according to the following formula of Equation 1:

$$P(k) = \binom{n-1}{k} p^k (1-p)^{n-1-k}$$ Equation 1

Many types of real-world graphs of networks such as ANPR networks, social networks, paper citation networks, the World Wide Web and biological networks mentioned above are types of scale-free networks. Unlike random graph networks, scale-free networks have degree distributions that, for large values of k approximately follow a power law, such as $P(k) \sim k^{-\wp}$, where $\wp$ is a constant whose value is typically, although not necessarily, between two and three.

A characteristic of scale-free networks is that a few vertices have many connections, while many other vertices have only a few connections. Embodiments of the present invention utilize this characteristic to provide an improved method and system of path compression of a network graph.

For any vertex in a graph, it is possible to describe a "hop" from that vertex to another vertex in a variety of known ways. These include as an "edge id", which is an edge identifier which can be used to uniquely identify a hop along the edge associated with the edge id from a first vertex to a second vertex. They also include a "vertex id", which can be used to deduce a hop to a second vertex if the graph does not permit parallel connections between two vertices. In this example, the first vertex is known as it is the current vertex. An edge id or a vertex id may typically be represented by a 32 bit integer, a 64 bit integer or a string of arbitrary length. The encoding of a single hop may be of the form:

<path-length> <start-vertex> <hop-0> <hop-1> . . . <hop-n> where:
  path-length is the length of the path, so that multiple paths in a single file can be delimited;
  start-vertex is the start vertex of the path; and
  hop-{x} is the details of each hop in the path.

Using this canonical format, a single path of length 5, using 32 bit integers (4 bytes), is represented by 4*(1+1+5)=28 bytes of data. Similarly, using 64 bit integers (8 bytes), the single path is represented by 56 bytes of data. Because of the large amount of redundant data contained in the above representations, it is typically possible to compress files encoded in this way by between 50% and 90%. In the simple example of FIG. 1, there are ten edges and nine vertices, so each edge id will need to be encoded with an integer in the range between zero and nine and each vertex id will need to be encoded with an integer in the range between zero and eight.

Embodiments of the present invention use a third type of description for a hop, which will be referred to as an "edge offset". An edge offset identifies the hop as the $n^{th}$ edge in an ordering of outgoing edges of a vertex. In an embodiment, the ordering of the outgoing edges starts at zero and continues until all outgoing edges from the vertex have been ordered. Other embodiments, starting at values other than zero may be used. This form of encoding removes the maximum amount of redundant information possible by using a more compact representation. In an embodiment, the ordering of the connected vertices or edges of a given vertex may be lexicographical. In another embodiment, the ordering may be determined using a timestamp of when the edge was last taken. Other embodiments may use other means of ordering of the connected vertices or edges.

In the example of FIG. 1, the ordering of the edges is shown by the numbers associated with each of the edges at each of the vertices. These numbers start from zero and continue clockwise round the vertex until all edges at the vertex are numbered. For example, vertex 3 has an edge 0 connecting it to vertex 4, an edge 1 connecting it to vertex 5, an edge 2 connecting it to vertex 1 and an edge 3 connecting it to vertex 2.

By knowing the edge offset and the out-degree of a vertex, that is, its number of outbound connections, the hop can be encoded as an integer "edge offset" within the range 0<=edge offset<=out-degree. By encoding the hop as an edge offset, the total number of symbols required to describe any hop in a graph can be reduced from the total number of edges in a graph to the maximum degree of any vertex. In the example of FIG. 1, there are ten edges in the graph, but the maximum degree of any vertex is four. So each edge offset will need to be encoded as an integer in the range between zero and three. On average, the probability of any symbol being required for any single hop will follow a positively skewed normal distribution. The reduction in the total number of symbols required and the positively skewed normal distribution for the distribution of symbols may be exploited when the path is compressed by a universal compressor, such as GZIP, according to known methods. Other implementations of universal compressors include zip, pkzip, zlib, jzlib and png.

Figure 3:
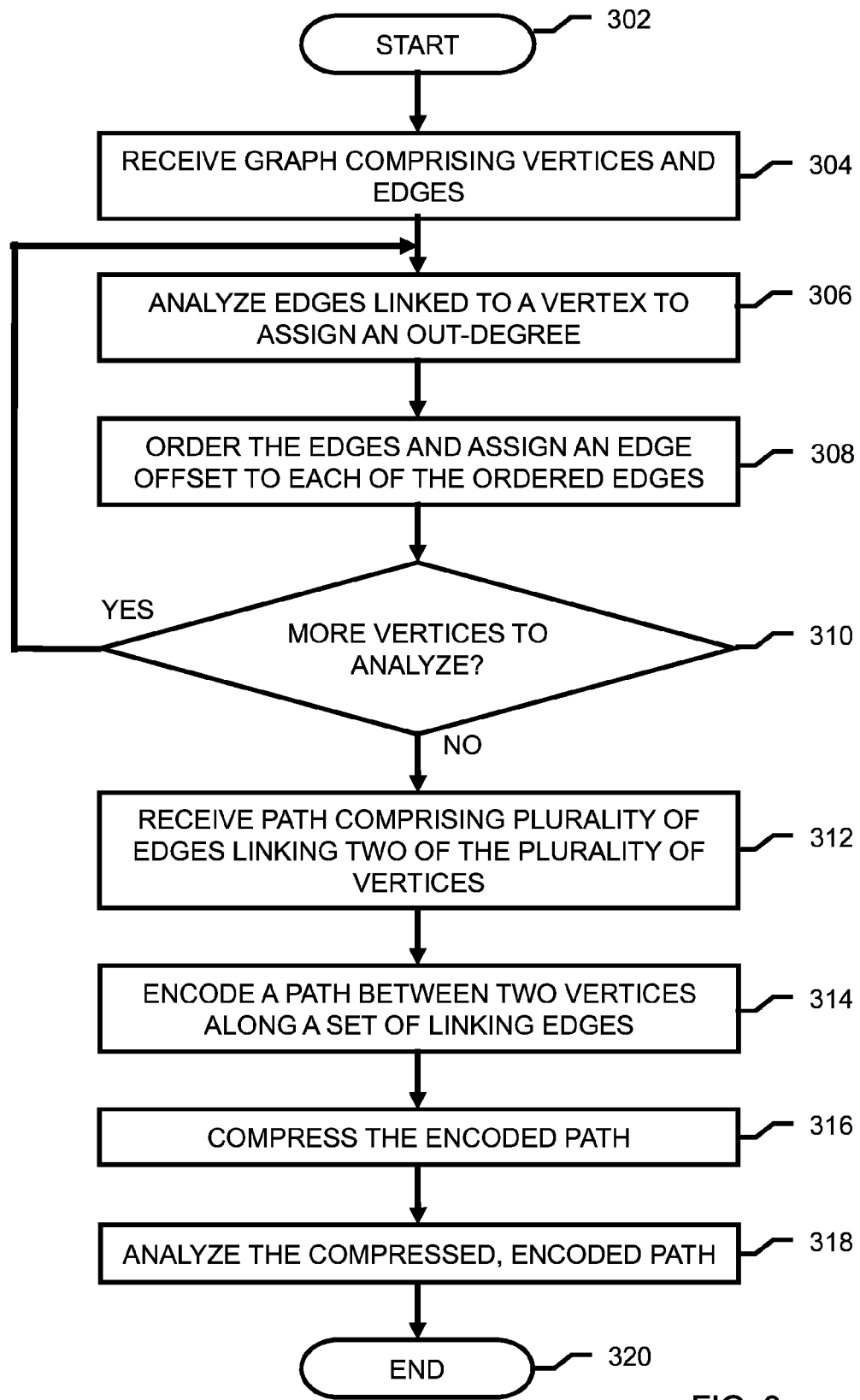
FIG. 3 shows a flow chart of an embodiment of a method of compressing paths on a graph according to the present invention.

FIG. 3 shows a flow chart of an embodiment of a method of analyzing a path on a graph according to the present invention. The method starts at step 302. At step 304, a graph is received. The graph comprises a plurality of vertices and a plurality of edges, each of the edges linking two of the vertices. In the example graph of FIG. 1, the graph comprises the set of nine vertices numbered from 1 to 9 and the set of ten undirected edges. In another embodiment, the graph may comprise the same vertices and twenty directed edges. Steps 306 and 308 are carried out for each one of the plurality of vertices until there are no more vertices to be analyzed.

At step 306, the edges linked to the vertex are analyzed to determine the number of outbound links from the vertex. As explained above, the number of outbound connections from the vertex is referred to as the out-degree of the vertex. In the example of FIG. 1, nodes 6, 7, 9 and 4 have an out-degree of one, node 5 has an out-degree of two, nodes 8 and 1 have an out-degree of three and nodes 2 and 3 have an out-degree of four.

At step 308, the edges are ordered and a value is assigned to each one of the ordered edges. As explained above, the assigned value is referred to as the edge-offset. In the example of FIG. 1, the edges at each vertex are ordered, starting at zero and ending at a maximum of three. The edges may be ordered lexicographically or using a timestamp of when the edge was last taken and may be ordered starting at zero or starting at values other than zero. Other ways of ordering the edges may be used. In an embodiment, the value assigned to each of the ordered edges represents an offset from a first one of the edges.

At decision step 310, a check is made to determine whether there are more vertices in the graph to analyze. If there are more vertices to analyze (decision step 310, "yes" branch), then processing returns to step 306. If there are no more vertices to analyze (decision step 310, "no" branch), then processing continues to step 312.

In a variation of the embodiment described above, at step 306, all of the edges linked to all of the vertices are first analyzed, then all of the vertices are assigned an out-degree. In this embodiment, at step 308, all of the edges are ordered and edge offsets are assigned to each one of the ordered edges associated with all of the vertices. No check is then required at step 310.

At step 312, a path is received. The path comprises a plurality of edges linking two of the plurality of vertices through at least one other vertex. In the example of FIG. 1, the path comprises the edges linking vertices 6 and 8, 8 and 2, 2 and 1 and 1 and 5.

At step 314, a path between two vertices of the graph along a set of linking edges is encoded. The encoding uses the out-degrees and the edge offsets of the two vertices, the linking edges, and other vertices along the path. In the example of FIG. 1 shown by the dotted curved lines, the path length from vertex 6 to vertex 5 is four. The start-vertex is vertex 6. The first hop from vertex 6 to vertex 8 is along the edge having an edge id of "0". The second hop from vertex 8 to vertex 2 is along the edge having an edge id of "0". The third hop from vertex 2 to vertex 1 is along the edge having an edge id of "1". The fourth hop from vertex 1 to vertex 5 is along the edge having an edge id of "0". As mentioned above, the encoding of a single hop may be of the form:

<path-length> <start-vertex> <hop-0> <hop-1> . . . <hop-n>

The example of FIG. 1 shown by the dashed curved lines, may be encoded as <4> <6> <0> <0> <1> <0>.

The other example mentioned earlier (not shown in FIG. 1) of a path starting at vertex 6 and goes through vertices 8, 2, 1, 3, 2 and 1 to vertex 5 may be simply represented as <7> <6> <0> <0> <1> <2> <3> <1> <0>.

In an embodiment, each of the assigned values in the path is encoded as an integer in the range between zero and the out-degree, that is the number of outbound links.

At step 316, the encoded path generated at step 314 is further compressed using a known compression algorithm, such as, for example, the DEFLATE algorithm used in .zip, .gzip and .png formats.

At step 318, the compressed, encoded path is analyzed using an analysis method known to one skilled in the art.

The method ends at step 320.

In a preferred embodiment of bitwise-offset encoding, if the out-degree of vertices is known a-priori by both the encoder and the decoder, then it is possible to represent the offset with the absolute number of bits required to represent any offset from that vertex. This may be defined as follows in Equation 2 as the "symbol size" of the vertex:

$$\text{symbolSize}(④)=1+\text{floor}(\log_2(\text{outDegree}_④-1)) \quad \text{Equation 2}$$

The offset values start from zero and end at (outDegree-1).

In the example of FIG. 1, the largest out-degree of a vertex is four, so a symbol of only $1+\text{floor}(\log_2 (4-1))=2$ bits is required to encode an offset from a vertex v. In an embodiment where only the largest value of out-degree for vertices is known, then each of the offsets needs only the symbol size number of bits to encode an offset. Comparing the example of FIG. 1, the edge offset requires 4 bits only to encode in comparison with the 32 bits of a known 4 byte integer representation, thus saving 28 bits for each hop. As scale-free networks have large numbers of vertices that have relatively low out-degree values, the bitwise-offset encoding embodiment becomes more efficient at encoding paths on such graphs.

In an embodiment, each of the assigned values in the path is encoded as a minimum number of bits needed to represent the assigned value in the range between zero and the number of outbound links.

Embodiments of the invention provide a simple and robust mechanism to implement path compression which outperforms sophisticated compression algorithms when used on its own. Embodiments of the invention can be combined with compression algorithms known to those skilled in the art to perform even better.

Figure 4:
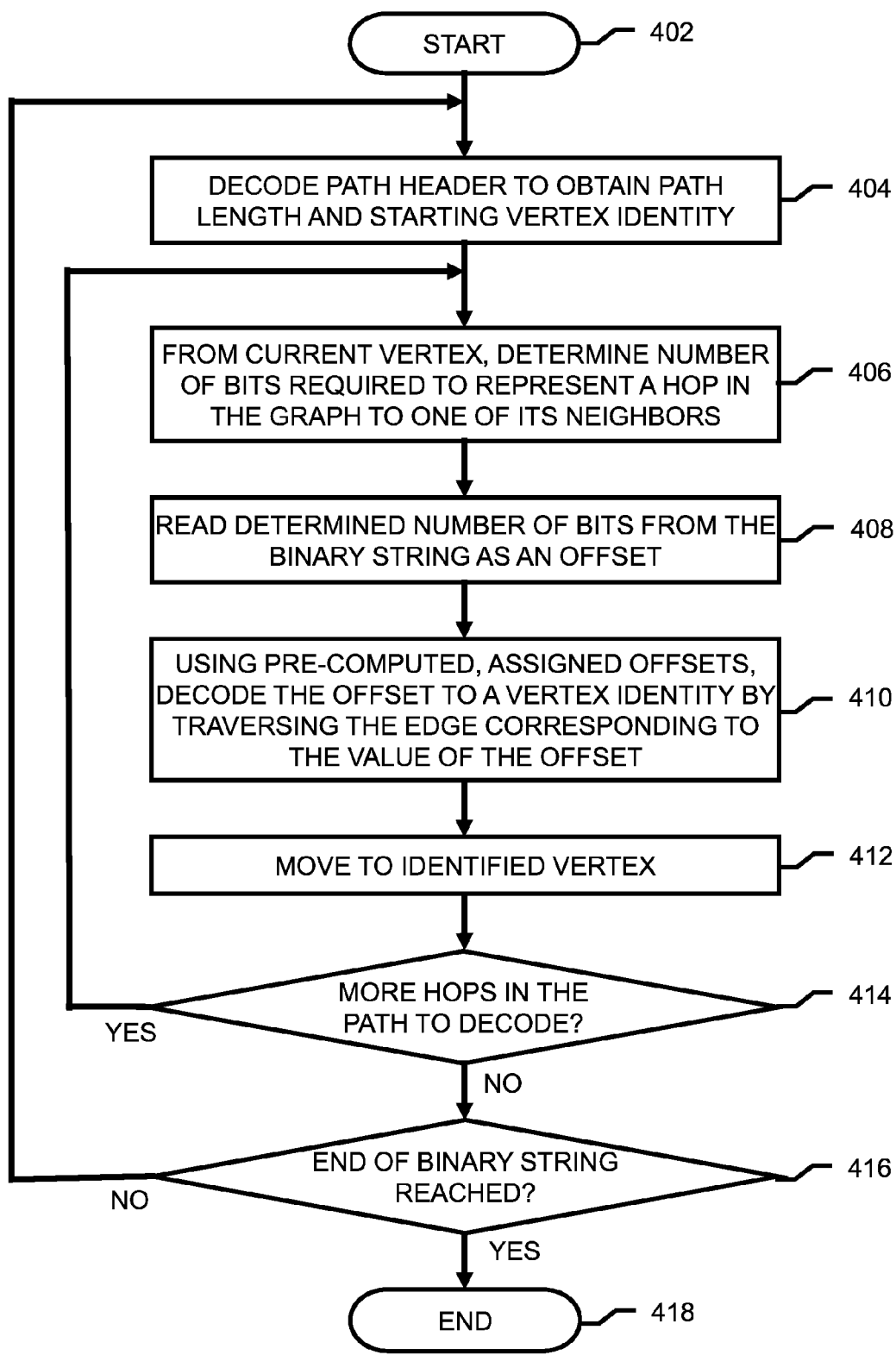
FIG. 4 shows a flow chart of an embodiment of a method of decoding the compressed paths generated by the method shown in FIG. 3.

The method of decoding a path encoded according to the present invention follows the same principles that are described above for encoding the path, but in reverse. The method of decoding starts with the binary string encoded path representation, which in a typical embodiment represents many different paths through the same network in a single binary string. During decoding, the network underlying the path must be identical to the one used during the encoding of FIG. 3 and a deterministic way of assigning offsets such as lexicographical or using a timestamp must be used. Referring to FIG. 4, which is a flow chart of an embodiment of a method of decoding the compressed paths generated by the method shown in FIG. 3. The method starts at step 402. At step 404, the path header in the binary string representation is decoded so as to obtain the path length and the starting vertex identity. At step 406, from the current vertex, the number of bits required to represent a hop from that vertex in the graph to one of its neighbors is determined. At step 408, the determined number of bits is read from the binary string as an offset. At step 410, the offset is decoded to a vertex identity by traversing the edge corresponding to the value of the offset. This is done using the pre-computed, assigned offsets. At step 412, a move is made to the identified vertex.

At decision step 414, a check is made to determine whether there are any more hops in the path to decode. If there are more hops in the path to decode (decision step 414, "yes" branch), then processing returns to step 406. If there are no more hops in the path to decode (decision step 414, "no" branch), then processing continues to step 416. At step 416, a check is made to determine to whether the end of the binary string has been reached. If the end of the binary string has not been reached (decision step 416, "no" branch), that is there are more paths to decode, the processing returns to step 404 to decode the next path. If the end of the binary string has been reached (decision step 416, "yes" branch), that is there are no more paths to decode, then the method ends at step 418.

As examples of the advantage of embodiments of the present invention when compared to known compression algorithms, the following benchmarks compare the known standard type of encoding with embodiments of the offset and bitwise-offset types of encoding according to the present invention. The benchmarks also compare the encoded data after it has been compressed with the popular DEFLATE algorithm used in .zip, .gzip and .png formats for compressing 50,000 paths over a range of graphs of different sizes and densities.

In a first example, a weighted random walk is compared. This simulates a real-world transport network. A randomly generated path of up to a given length through a network was generated using a model known to those skilled in the art, the Watts & Strogatz random graph generation model. The selection of paths are weighted such that they typically fall on the minimum-spanning-tree of the graph, which represents major-roads on the network. One would expect the DEFLATE algorithm to perform well on such a dataset because of the predictability of hops. In this example, 20,000 vertices were used, 60,000 edges were used and 50,000 paths were used. The maximum length of the weighted random walk was 20 hops.

TABLE 1

|  | Standard | Offset | Bitwise-offset |
|---|---|---|---|
| Uncompressed | 4.2 Mb | 4.2 Mb | 560 kb |
| DEFLATEd | 1.46 Mb | 670 kb | 460 kb |

As depicted in Table 1 above, on this 20K vertex, 60K edge graph, the 32-bit encoding produced a file of 4.2 Mb which compressed 65% using DEFLATE, resulting in a path-file of 1.46 Mb. Using bitwise-offset encoding, the same data can be encoded in 560 kb, which is a 2.6× improvement on DEFLATEd standard encoding. The resulting file can be passed through DEFLATE and compressed a further 17.8% to 460 kb.

In a second example, a random walk is compared.

TABLE 2

|  | Standard | Offset | Bitwise-offset |
|---|---|---|---|
| Uncompressed | 4.2 Mb | 4.2 Mb | 560 kb |
| DEFLATEd | 2.05 Mb | 715 kb | 463 kb |

In a random walk through the graph, it is to be expected that the GZIP algorithm using DEFLATE would not perform as well. The offset encoding, however, remains substantially constant as it is not affected by the predictability of the data, as depicted in Table 2 above. The compressed version of the offset encoded data is more resistant to the high entropy in the underlying data, because of its more durable statistical properties.

In a third example, a highly-regular walk was compared. 500 paths were generated and repeated 100 times each to produce a very non-random, highly predictable, if unrealistic, dataset. Such data would be expected to favor the DEFLATE algorithm.

TABLE 3

|  | Standard | Offset | Bitwise-offset |
|---|---|---|---|
| Uncompressed | 3.7 Mb | 3.7 Mb | 0.5 Mb |
| DEFLATEd | 33 kb | 23 kb | 27 kb |

The results, depicted in Table 3 above, show that offset-encoding (after compression) performs better than standard compression by a factor of 1.4. Bitwise-offset encoding (after compression) performs slightly worse than this because this encoding introduces much more entropy compared to the very low entropy of the input data.

Figure 5:
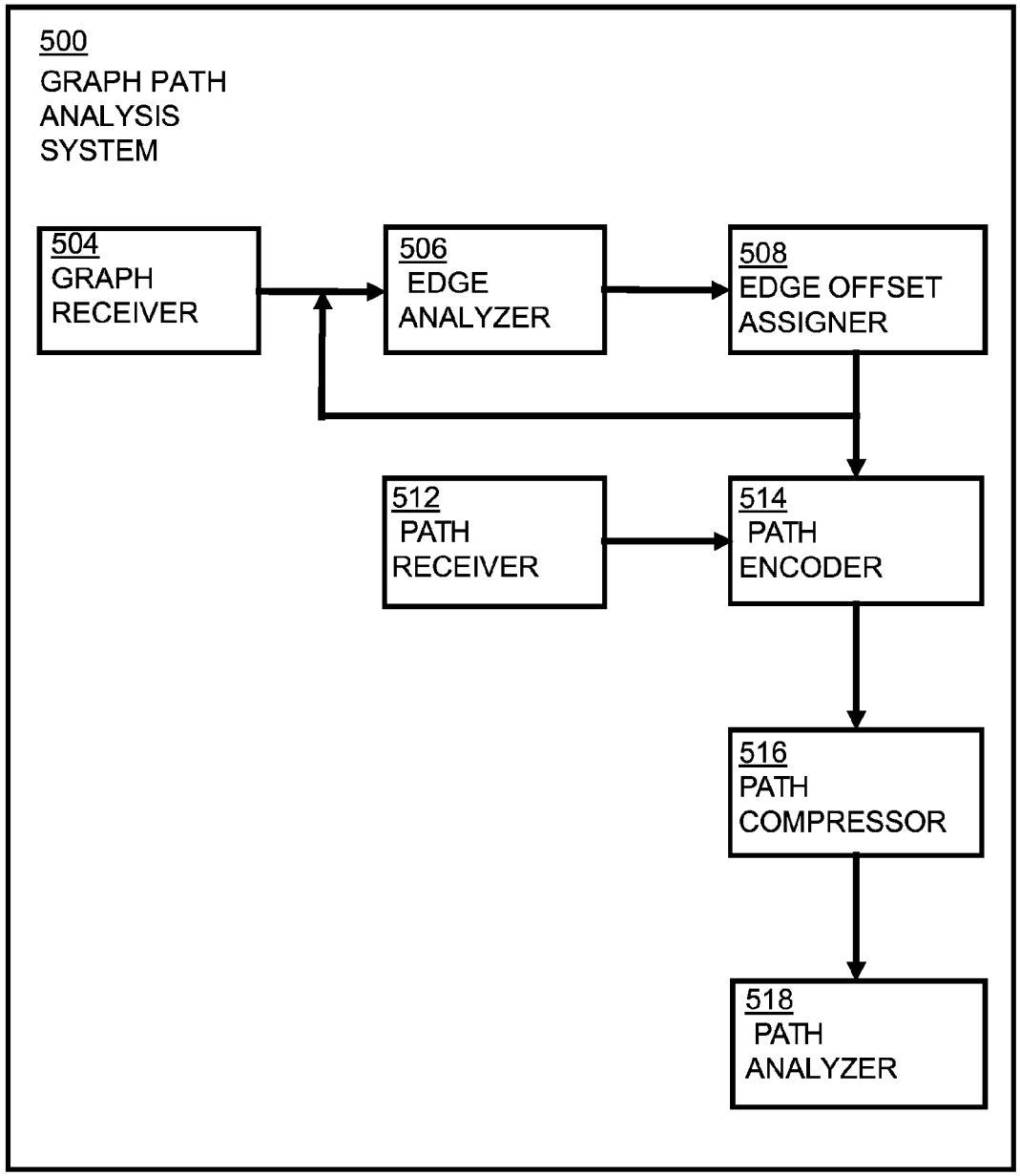
FIG. 5 shows a block diagram of a system of compressing graphs on a path according to an embodiment of the present invention.

Referring to FIG. 5, which shows a block diagram of a graph path analysis system 500 of analyzing a path on a graph according to the present invention. Graph receiver 504 receives the graph, which comprises a plurality of vertices and a plurality of edges, each of the edges linking two of the vertices. Edge analyzer 506 analyzes the edges linked to the vertex to determine the number of outbound links from the vertex. As explained above, the number of outbound connections from the vertex is referred to as the out-degree of the vertex. Edge offset assigner 508 orders the edges and assigns a value to each one of the ordered edges. The edges may be ordered lexicographically or using a timestamp of when the edge was last taken and may be ordered starting at zero or starting at values other than zero. In an embodiment, the value assigned to each of the ordered edges represents an offset from a first one of the edges.

When edge offset assigner 508 has assigned an edge offset it check whether there are any more vertices to be analyzed. If there are more vertices to analyze, then it returns control to edge analyzer 506 to process the next vertex. If there are no more vertices to analyze, then edge offset assigner 508 passes control to path encoder 514.

Path receiver 512 receives a path, which comprises a plurality of edges linking two of the plurality of vertices through at least one other vertex.

Path encoder 514 encodes the path between two vertices of the graph along a set of linking edges received by path receiver 512. The encoding uses the out-degrees and the edge offsets of the two vertices, the linking edges, and other vertices along the path.

In an embodiment, each of the assigned values in the path is encoded as an integer in the range between zero and the out-degree, that is the number of outbound links.

In an embodiment, edge analyzer 506 analyzes all of the edges linked to all of the vertices and then all of the vertices are assigned an out-degree. In this embodiment, edge offset assigner 508 orders all of the edges and assigns edge offsets to each one of the ordered edges associated with all of the vertices. Control goes directly from edge offset assigner 508 to path encoder 514 when this is completed.

In an embodiment, each of the assigned values in the path is encoded as an integer in the range between zero and the out-degree, that is the number of outbound links.

Path compressor 516 further compresses the encoded path generated by path encoder 514 using a prior art compression algorithm, such as, for example, the DEFLATE algorithm used in .zip, .gzip and .png formats.

In an embodiment of the invention, the path compressor uses known data compressor hardware, such as, for example, the AHA363-PCIX, AHA364-PCIX and AHA367-PCIX PCI-X cards from Comtech, the StorCompress 300 and MX3 range of PCI or PCI-X cards from Indra networks and the Nitrox® and Octeon® processors from Cavium Inc.

Path analyzer 518 analyzes the compressed, encoded path.

Figure 6:
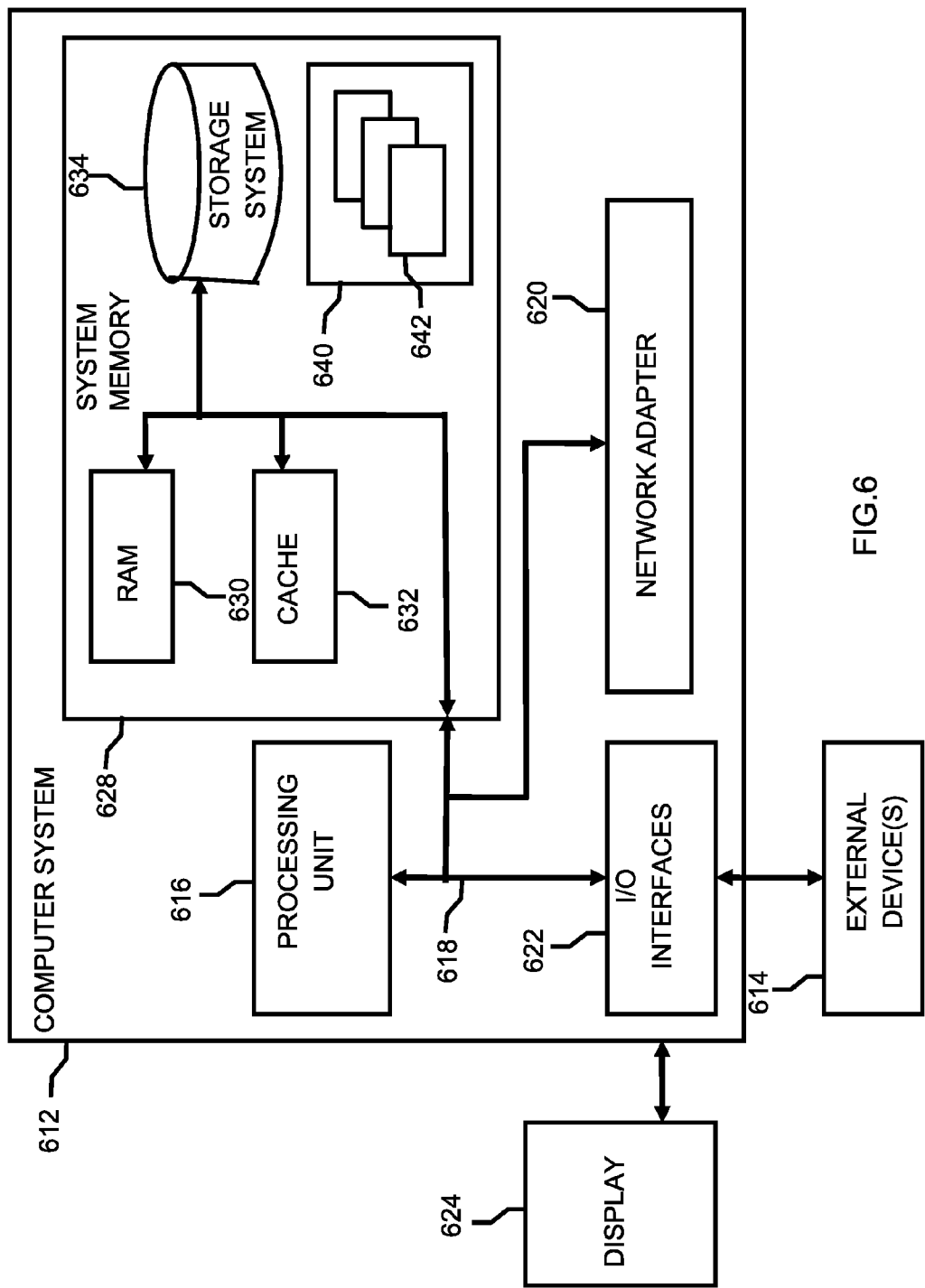
FIG. 6 shows a computer system in which embodiments of the present invention may be used.

Referring now to FIG. 6, a schematic of an example of computing system is shown. Computer system 612 is only one example of a suitable computing system and is not intended to suggest any limitation as to the scope of use or functionality of embodiments of the invention described herein. Regardless, computer system 612 is capable of being implemented and/or performing any of the functionality set forth hereinabove.

Computer system 612 is operational with numerous other general purpose or special purpose computing system environments or configurations. Examples of well-known computing systems, environments, and/or configurations that may be suitable for use with computer system 612 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 612 may be described in the general context of computer system-executable instructions, such as program modules, being executed by a computer system. Generally, program modules may include routines, programs, objects, components, logic, data structures, and so on that perform particular tasks or implement particular abstract data types. Computer system 612 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system 612 is shown in the form of a general-purpose computing device. The components of computer system 612 may include, but are not limited to, one or more processors or processing units 616, a system memory 628, and a bus 618 that couples various system components including system memory 628 to processor 616.

Bus 618 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 612 typically includes a variety of computer system readable media. Such media may be any available media that is accessible by computer system 612, and it includes both volatile and non-volatile media, removable and non-removable media.

System memory 628 can include computer system readable media in the form of volatile memory, such as random access memory (RAM) 630 and/or cache memory 632. Computer system 612 may further include other removable/non-removable, volatile/non-volatile computer system storage media. By way of example only, storage system 634 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 618 by one or more data media interfaces. As will be further depicted and described below, memory 628 may include at least one program product having a set (e.g., at least one) of program modules that are configured to carry out the functions of embodiments of the invention.

Program/utility 640, having a set (at least one) of program modules 642, may be stored in memory 628 by way of example, and not limitation, as well as an operating system, one or more application programs, other program modules, and program data. Each of the operating system, one or more application programs, other program modules, and program data or some combination thereof, may include an implementation of a networking environment. Program modules 642 generally carry out the functions and/or methodologies of embodiments of the invention as described herein.

Computer system 612 may also communicate with one or more external devices 614 such as a keyboard, a pointing device, a display 624, etc.; one or more devices that enable a user to interact with computer system 612; and/or any devices (e.g., network card, modem, etc.) that enable computer system 612 to communicate with one or more other computing devices. Such communication can occur via Input/Output (I/O) interfaces 622. Still yet, computer system 612 can communicate with one or more networks such as a local area network (LAN), a general wide area network (WAN), and/or a public network (e.g., the Internet) via network adapter 620. As depicted, network adapter 620 communicates with the other components of computer system 612 via bus 618. It should be understood that although not shown, other hardware and/or software components could be used in conjunction with computer system 612. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, column-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of analyzing and encoding a path on a network graph, the method comprising:
   receiving, by one or more computer processors, a graph, said graph comprising a plurality of vertices and a plurality of edges, each of said edges linking two of said plurality of vertices;
   for each one of said plurality of vertices:
      analyzing, by one or more computer processors, said edges linked to said one of said plurality of vertices to determine a number of outbound links from said one of said plurality of vertices; and
      ordering, by one or more computer processors, said edges and assigning a value to each of said ordered edges;
   for the graph:
      receiving, by one or more computer processors, a path, said path comprising a plurality of said plurality of edges linking two of said plurality of vertices through at least one other of said plurality of vertices;
      encoding, by one or more computer processors, said path, the encoding using said determined number of outbound links and said assigned values of each of said one or more edges linking said two of said plurality of vertices and said encoded path comprises at least a path length of said path, a start vertex of said path and one or more associated outbound links from said number of outbound links to traverse said path;

compressing, by one or more computer processors, said encoded path; and analyzing, by one or more computer processors, said path on said graph using said compressed, encoded path.

2. The computer-implemented method of claim 1, wherein said value assigned to each of said ordered edges represents an offset from a first one of said edges.

3. The computer-implemented method of claim 1, wherein said edges are ordered lexicographically.

4. The computer-implemented method of claim 1, wherein said encoding said path comprises encoding, by one or more computer processors, each of the assigned values as an integer in a range between zero and said number of outbound links.

5. The computer-implemented method of claim 1, wherein said encoding said path comprises encoding, by one or more computer processors, each of the assigned values as a minimum number of bits needed to represent said assigned value in a range between zero and said number of outbound links.

6. The computer-implemented method of claim 1, wherein said encoded path is compressed using a DEFLATE algorithm.

7. The computer-implemented method of claim 1, further comprising decoding, by one or more computer processors, said compressed, encoded path.

* * * * *